(12) United States Patent
Lee et al.

(10) Patent No.: US 8,405,426 B2
(45) Date of Patent: Mar. 26, 2013

(54) METHOD AND APPARATUS TO SERIALIZE PARALLEL DATA INPUT VALUES

(75) Inventors: Chulkyu Lee, San Diego, CA (US); Harry H. Dang, San Diego, CA (US); Abhay S. Dixit, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 12/789,566

(22) Filed: May 28, 2010

(65) Prior Publication Data

US 2011/0291703 A1 Dec. 1, 2011

(51) Int. Cl.
*H03K 19/00* (2006.01)
(52) U.S. Cl. ....................................................... 326/93
(58) Field of Classification Search .................. 326/93, 326/104, 114, 125
See application file for complete search history.

(56) References Cited

U.S. PATENT DOCUMENTS

| | | | |
|---|---|---|---|
| 5,111,455 A | 5/1992 | Negus | |
| 5,982,309 A | 11/1999 | Xi et al. | |
| 7,154,918 B2 | 12/2006 | Takauchi et al. | |
| 7,187,727 B2 | 3/2007 | Saeki | |
| 7,340,021 B1 | 3/2008 | Churchill et al. | |
| 7,772,879 B1* | 8/2010 | Feng et al. | 326/38 |
| 2001/0050585 A1* | 12/2001 | Carr | 327/277 |
| 2007/0073943 A1 | 3/2007 | Saeki et al. | |
| 2008/0129335 A1* | 6/2008 | Hutchings et al. | 326/41 |
| 2008/0170587 A1 | 7/2008 | Kershteyn | |
| 2010/0195776 A1* | 8/2010 | Chmelar et al. | 375/359 |
| 2010/0271068 A1* | 10/2010 | Feng et al. | 326/53 |

FOREIGN PATENT DOCUMENTS

| | | |
|---|---|---|
| EP | 0346896 A2 | 12/1989 |
| EP | 0717496 A1 | 6/1996 |
| EP | 1482642 A2 | 12/2004 |
| FR | 2729528 A1 | 7/1996 |

OTHER PUBLICATIONS

Lu, Hungwen et al. "A 1.25 to 5Gbps LVDS Transmitter with a Novel Multi-Phase Tree-Type Multiplexer," IEEE, Asian Solid-State Circuit Conference, 2005, pp. 389-392.
Lu, Hung-Wen et al. "A 5Gbps CMOS LVDS Transmitter with Multi-Phase Tree-Type Multiplexer," Proceedings of 2004 IEEE Asia-Pacific Conference on Advanced System Integrated Circuits, Aug. 4-5, 2004, pp. 228-231.
"A 40 Gb/s CMOS Transceiver Chipset for Optical Communication Systems," NSC93-2213-E-002-109, Oct. 18, 1994, 7 pages.
International Search Report and Written Opinion—PCT/US2011/038086, ISA/EPO—Nov. 4, 2011.

* cited by examiner

*Primary Examiner* — Thienvu Tran
(74) *Attorney, Agent, or Firm* — Sam Talpalatsky; Nicholas J. Pauley; Jonathan T. Velasco

(57) ABSTRACT

A method and apparatus to serialize parallel data input values is disclosed. In a particular embodiment, a method of serializing parallel data input values includes receiving multiple data input values in parallel at an input tier of a selection circuit, where the input tier includes multiple combinatorial gate multiplexers. The method further includes selecting an output value at an output tier of the selection circuit, where the output tier includes at least one combinatorial gate multiplexer.

36 Claims, 8 Drawing Sheets

METHOD AND APPARATUS TO SERIALIZE PARALLEL DATA INPUT VALUES

I. FIELD

The present disclosure is generally related to a method and apparatus to serialize parallel data input values.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Many such wireless telephones incorporate additional devices to provide enhanced functionality for end users. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Portable computing devices may require the conversion of parallel data values to serial data values. For example, a display controller in the portable computing device may output parallel data values that need to be serialized before being sent to the display. In some cases, the number of data values provided in parallel is an odd number or an even number that is not a power of two. Implementations configured to handle these cases may suffer from increased complexity in the conversion process, bandwidth limitations, high power consumption, and low jitter requirements.

III. SUMMARY

A selection circuit is described that may be a low-power high-speed multiplexer or data serializer using low voltage differential signaling (LVDS). The selection circuit may be implemented using latch-free combinatorial logic circuits in a tree structure that receive parallel data input values and provide serial data output values.

The combinatorial logic circuits may be combinatorial gate multiplexers, such as NAND gate multiplexers. The selection circuit may include multiple tiers in which combinatorial gate multiplexers may serve as selection elements, delay elements, logic operation elements, or any combination thereof. Multi-phase clock signals may provide control signals to the combinatorial logic circuits of the selection circuit. The multi-phase clock signals may each have a different phase, but the same period. The period of the multi-phase clock signals may be approximately the same as that of a system clock to reduce power consumption. The output tier of the selection circuit may include a combinatorial gate multiplexer as a root selection element to select between data provided from different branches in the tree structure. The multi-phase clock signals may be applied to different tiers of the tree structure such that the root selection element provides serial output data in a particular sequence.

In a particular embodiment, a method of serializing parallel data input values includes receiving multiple data input values in parallel at an input tier of a selection circuit, where the input tier includes multiple combinatorial gate multiplexers. The method further includes selecting an output value at an output tier of the selection circuit, where the output tier includes at least one combinatorial gate multiplexer.

In another particular embodiment, the method includes receiving a first data input and a second data input at a combinatorial logic circuit. The method further includes receiving a first signal at a first control input of the combinatorial logic circuit. The first signal is formed by combining a first clock signal having a first phase with a second clock signal having a second phase. The method further includes receiving a second signal at a second control input of the combinatorial logic circuit. The second signal is formed by combining a third clock signal having a third phase with a fourth clock signal having a fourth phase. The method further includes selecting the first data input or the second data input as a selected output based on the first signal and the second signal.

In another particular embodiment, the method includes applying a clock signal having an uneven duty cycle to a control input of at least one selection element of a selection circuit. The selection circuit has a tree structure that includes multiple selection elements. The tree structure includes a data input tier and a data output tier.

In another particular embodiment, an apparatus includes an input set of selection elements in an input tier of a tree structure and a selection element in an output tier of the tree structure. The input tier includes inputs to receive input data from a parallel interface, and the output tier includes an output to provide serial output data. At least one of the selection elements includes a latch-free circuit that includes NAND logic circuits.

One particular advantage provided by at least one of the disclosed embodiments is that the high speed data serializer is capable of high speed, low power, and robust conversion of parallel data input values to serial data output values, where the number of parallel data input values may be an odd number or an even number that is not a power of two.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

A selection circuit is described that may be a low-power high-speed multiplexer or data serializer implemented using latch-free combinatorial gate multiplexers in a tree structure. The selection circuit receives multiple data input values in parallel at an input tier and selects an output value at an output tier. The input tier may include multiple combinatorial gate multiplexers, and the output tier may include at least one combinatorial gate multiplexer.

Figure 1:
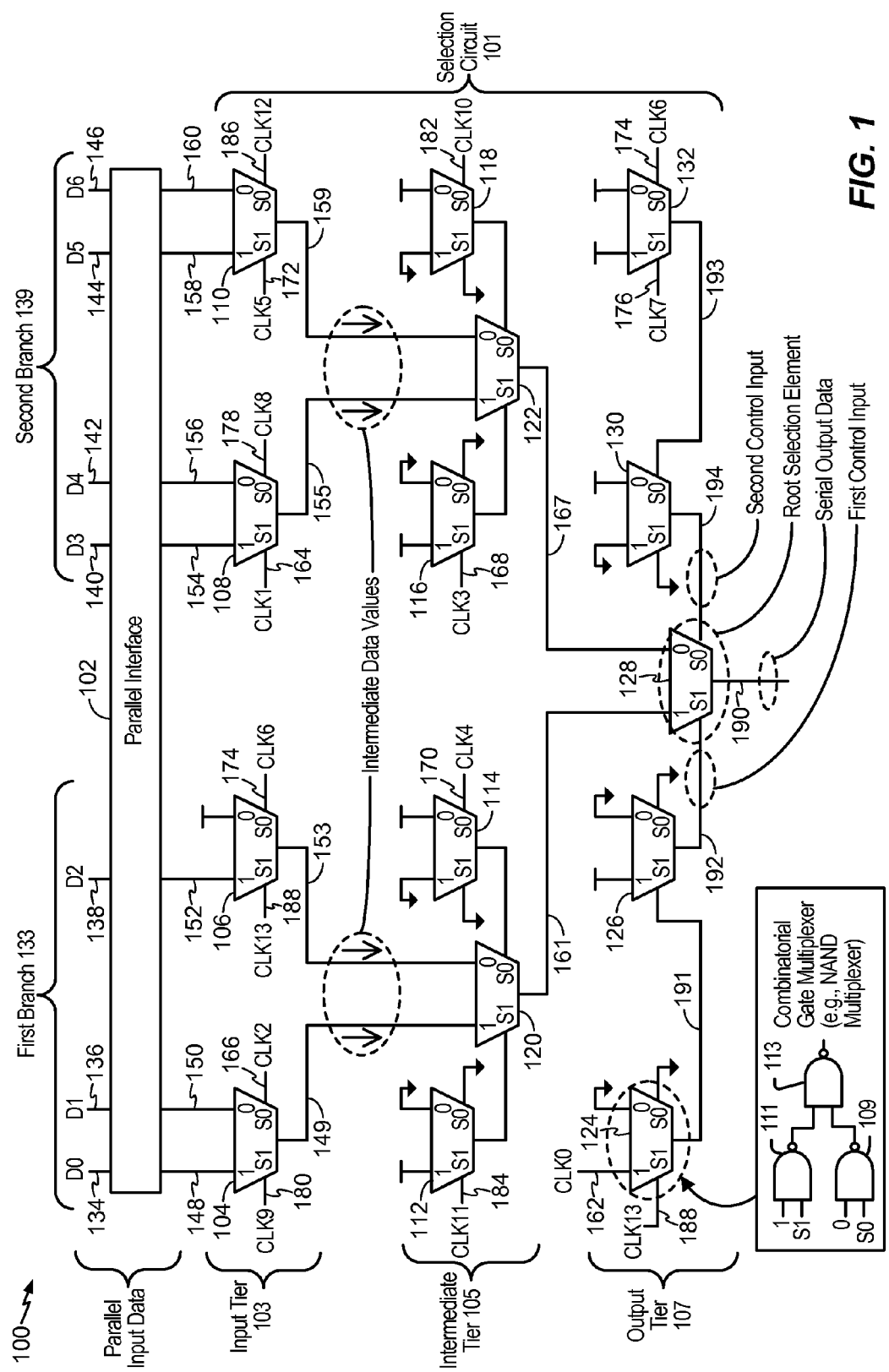
FIG. 1 is a diagram of a particular illustrative embodiment of an apparatus with a selection circuit having a tree structure that can be used to serialize parallel data input values.

Referring to FIG. 1, a particular illustrative embodiment of an apparatus that is operable to serialize parallel data input values is disclosed and generally designated 100. The apparatus 100 includes a parallel interface 102 and a selection circuit 101 having multiple combinatorial logic circuits, such as a representative combinatorial logic circuit 124 illustrated as including a combinatorial gate multiplexer. The multiple combinatorial logic circuits may be multiple combinatorial gate multiplexers and may be distributed to form a tree structure. The apparatus 100 may be configured in a tree structure and may include a first branch 133 and a second branch 139 of the tree structure. The multiple combinatorial gate multiplexers may be grouped into multiple tiers, such as an input tier 103, an intermediate tier 105, and an output tier 107. The multiple combinatorial gate multiplexers may serve as selection elements, delay elements, logic operation elements, or any combination thereof. In an illustrative embodiment, each of the combinatorial gate multiplexers of the apparatus 100 has the same internal logic configuration.

The parallel interface 102 may be configured to receive parallel data input values D0-D6. However, it is to be understood that the parallel interface 102 may be configured to receive any number of parallel data input values. The input data values D0-D6 received at the parallel interface 102 may be provided to the input tier 103 that includes multiple combinatorial gate multiplexers. The data input value D0 is received at an interface input 134, the data input value D1 is received at an interface input 136, the data input value D2 is received at an interface input 138, the data input value D3 is received at an interface input 140, the data input value D4 is received at an interface input 142, the data input value D5 is received at an interface input 144, and the data input value D6 is received at an interface input 146. The interface inputs 134, 136, and 138 may provide the data input values D0-D2 to the first branch 133 and the interface inputs 140, 142, 144, and 146 may provide the data input values D3-D6 to the second branch 139.

The input tier 103 may include an input set of selection elements, such as combinatorial gate multiplexers 104, 106, 108, and 110. The input tier 103 includes inputs to receive input data from the parallel interface 102. The combinatorial gate multiplexer 104 may be configured to receive the data input value D0 via a data path 148 and to receive the data input value D1 via a data path 150. The combinatorial gate multiplexer 106 may be configured to receive the data input value D2 via a data path 152. The combinatorial gate multiplexer 108 may be configured to receive the data input value D3 via a data path 154 and to receive the data input value D4 via a data path 156. The combinatorial gate multiplexer 110 may be configured to receive the data input value D5 via a data path 158 and to receive the data input value D6 via a data path 160.

The combinatorial gate multiplexers in the input tier 103 also receive clock signals at control inputs to determine which data input values are passed to the next tier. For example, the combinatorial gate multiplexer 104 receives a CLK9 clock signal via a data path 180 and a CLK2 clock signal via a data path 166. The combinatorial gate multiplexer 106 receives a CLK13 clock signal via a data path 188 and a CLK6 clock signal via a data path 174. The combinatorial gate multiplexer 108 receives a CLK1 clock signal via a data path 164 and a CLK8 clock signal via a data path 178. The combinatorial gate multiplexer 110 receives a CLK5 clock signal via a data path 172 and a CLK12 clock signal via a data path 186.

The selected data input value at the combinatorial gate multiplexer 104 is passed as an intermediate data value to a combinatorial gate multiplexer 120 of the intermediate tier 105 via a data path 149. The selected data input value at the combinatorial gate multiplexer 106 is passed as an intermediate data value to the combinatorial gate multiplexer 120 of the intermediate tier 105 via a data path 153. The selected data input value at the combinatorial gate multiplexer 108 is passed as an intermediate data value to a combinatorial gate multiplexer 122 of the intermediate tier 105 via a data path 155. The selected data input value at the combinatorial gate multiplexer 110 is passed as an intermediate data value to the combinatorial gate multiplexer 122 of the intermediate tier 105 via a data path 159.

The intermediate tier 105 may include an intermediate set of selection elements, such as the combinatorial gate multiplexer 120 and the combinatorial gate multiplexer 122. The intermediate tier 105 is operative to select between data received from the input tier 103 and to provide selected data to the output tier 107. The intermediate tier 105 may further include a combinatorial gate multiplexer 112, a combinatorial gate multiplexer 114, a combinatorial gate multiplexer 116, and a combinatorial gate multiplexer 118. The combinatorial gate multiplexers 112, 114, 116, and 118 may be configured to operate as delay elements. An input 0 and its corresponding control input S0 of the combinatorial gate multiplexer 112 are tied to a low voltage potential, such as ground or a negative supply voltage VSS. An input 1 of the combinatorial gate multiplexer 112 is tied to a high voltage potential, such as a positive power supply voltage VSS, and its corresponding control input S1 receives a CLK11 clock signal via a data path 184. The output of the combinatorial gate multiplexer 112 is provided to a control input S1 of the combinatorial gate multiplexer 120 as a delayed version of the CLK11 clock signal.

An input 1 and its corresponding control input S1 of the combinatorial gate multiplexer 114 are tied to a low voltage potential, such as ground or a negative supply voltage VSS. An input 0 of the combinatorial gate multiplexer 114 is tied to a high voltage potential, such as a positive power supply voltage VDD, and its corresponding control input S0 receives a CLK4 clock signal via a data path 170. The output of the combinatorial gate multiplexer 114 is provided to a control input S0 of the combinatorial gate multiplexer 120 as a delayed version of the CLK4 clock signal.

An input 0 and its corresponding control input S0 of the combinatorial gate multiplexer 116 are tied to a low voltage potential, such as ground or a negative supply voltage VSS. An input 1 of the combinatorial gate multiplexer 116 is tied to a high voltage potential, such as a positive power supply voltage VDD, and its corresponding control input S1 receives a CLK3 clock signal via a data path 168. The output of the combinatorial gate multiplexer 116 is provided to a control input S1 of the combinatorial gate multiplexer 122 as a delayed version of the CLK3 clock signal.

An input 1 and its corresponding control input S1 of the combinatorial gate multiplexer 118 are tied to a low voltage potential, such as ground or a negative supply voltage VSS. An input 0 of the combinatorial gate multiplexer 118 is tied to a high voltage potential, such as a positive power supply voltage VDD, and its corresponding control input S0 receives a CLK10 clock signal via a data path 182. The output of the combinatorial gate multiplexer 118 is provided to a control input S0 of the combinatorial gate multiplexer 122 as a delayed version of the CLK10 clock signal.

The delayed version of the CLK11 clock signal and the delayed version of the CLK4 clock signal are provided to control inputs S1 and S0, respectively, of the combinatorial gate multiplexer 120 determine which intermediate data value to pass through to the output tier 107 via a data path 161. The delayed version of the CLK3 clock signal and the delayed version of the CLK10 clock signal provided to control inputs S1 and S0, respectively, of the combinatorial gate multiplexer 122 determine which intermediate data value to pass through to the output tier 107 via a data path 167.

The output tier 107 includes an output to provide serial output data. The output tier 107 also includes multiple combinatorial gate multiplexers, including a combinatorial gate multiplexer 124, a combinatorial gate multiplexer 126, a combinatorial gate multiplexer 128, a combinatorial gate multiplexer 130, and a combinatorial gate multiplexer 132. The combinatorial gate multiplexers 126 and 130 may be configured to operate as delay elements and the combinatorial gate multiplexer 128 may be configured to operate as a selection element. The combinatorial gate multiplexers 124 and 132 may be configured to operate as logic operation elements configured to perform a logic operation (e.g., AND and OR logic operations) and may also provide a delay. The delay elements, the selection element, the logic operation elements, or any combination thereof, may be configured with the same, or similar, combinatorial logic structure.

An input 0 and its corresponding control input S0 of the combinatorial gate multiplexer 124 are tied to a low voltage potential, such as ground or a negative supply voltage VSS. An input 1 of the combinatorial gate multiplexer 124 receives a CLK0 clock signal via a data path 162 and its corresponding control input S1 receives a CLK13 clock signal via the data path 188. The output of the combinatorial gate multiplexer 124 is provided to a control input S1 of the combinatorial gate multiplexer 126 as a first signal. The first signal is formed by the combination of the CLK0 clock signal and the CLK13 clock signal at the combinatorial gate multiplexer 124. For example, the combination may include an AND operation on the CLK0 clock signal and the CLK13 clock signal.

An input 0 and its corresponding control input S0 of the combinatorial gate multiplexer 126 are tied to a low voltage potential, such as ground or a negative supply voltage VSS. An input 1 of the combinatorial gate multiplexer 126 is tied to a high voltage potential, such as a positive power supply voltage VDD, and its corresponding control input S1 receives the first signal via a data path 191. The output of the combinatorial gate multiplexer 126 is provided to a first control input S1 of the combinatorial gate multiplexer 128 via a data path 192 as a delayed version of the first signal.

An input 0 of the combinatorial gate multiplexer 132 is tied to a high voltage potential, such as a positive power supply voltage VDD, and its corresponding control input S0 receives a CLK6 clock signal via the data path 174. An input 1 of the combinatorial gate multiplexer 132 is tied to a high voltage potential, such as a positive power supply voltage VDD, and its corresponding control input S1 receives a CLK7 clock signal via a data path 176. The output of the combinatorial gate multiplexer 132 is provided to a control input S0 of the combinatorial gate multiplexer 130 as a second signal. The second signal is formed by the combination of the CLK6 clock signal and the CLK7 clock signal at the combinatorial gate multiplexer 132. For example, the combination may include an OR operation on the CLK6 clock signal and the CLK7 clock signal.

An input 1 and its corresponding control input S1 of the combinatorial gate multiplexer 130 are tied to a low voltage potential, such as ground or a negative supply voltage VSS. An input 0 of the combinatorial gate multiplexer 130 is tied to a high voltage potential, such as a positive power supply voltage VDD, and its corresponding control input S0 receives the second signal via a data path 193. The output of the combinatorial gate multiplexer 130 is provided to a second control input S0 of the combinatorial gate multiplexer 128 via a data path 194 as a delayed version of the second signal.

The combinatorial gate multiplexer 128 is a root selection element that selects between the data values provided by the first branch 133 and the second branch 139 based on the delayed first signal at the first control input S1 and the delayed second signal at the second control input S0. The intermediate data value provided by the selected branch is passed through the root selection element and provided as serial output data at a data path 190.

In an illustrative embodiment, the tree structure of the selection circuit 101 is a balanced tree structure. Regardless of the number of parallel data input values, the tree structure may be configured to include the same number of selection elements in each branch where the branches are both coupled to a root selection element at the output tier for selecting between the branches. The balanced tree structure may include a root selection element (e.g., combinatorial gate multiplexer 128) having a first input from a first selection element, such as combinatorial gate multiplexer 120, of a first branch 133 of the tree structure and a second input from a second selection element, such as combinatorial gate multiplexer 122, of a second branch 139 of the tree structure. Also, each branch may include the same number of delay elements and logic operation elements.

In an illustrative embodiment, the combinatorial gate multiplexers may be latch-free circuits and may include NAND logic circuits. For example, one or more of the multiple combinatorial gate multiplexers may be a NAND multiplexer as illustrated for the combinatorial gate multiplexer 124 having three two-input NAND gates, in which a first NAND gate 109 has an input 0 and a control input S0 and a second NAND gate 111 has an input 1 and a control input S1. The output of the first NAND gate 109 and the second NAND gate 111 are provided to a third NAND gate 113, whose output is the output of the NAND multiplexer.

During operation, the selection circuit 101 can operate as a multiplexer or a serializer by receiving the multiple data input values in parallel at the input tier 103 of the selection circuit 101 and selecting an output value at the output tier 107 of the selection circuit 101 to generate a serial data output. Each of the multiple combinatorial gate multiplexers 104-110 in the input tier 103 can operate as a means for selecting first data in a first tier of the tree structure and the combinatorial gate multiplexer 128 can operate as a means for selecting second data (e.g., to provide serial output data) in a second tier of the tree structure. The means for selecting the first data and the means for selecting the second data may be latch-free circuits and may include NAND logic circuits.

The selection circuit 101 may be configured to operate as a serializer by providing the multi-phase clock signals to the selection circuit 101 in such a way that the appropriate data input value is selected at the serial output. As will be illustrated further in FIG. 2, the control signals provided to the root selection element 128 of the output tier 107 may have duty cycles that are complementary and match the number of parallel inputs provided to their respective branches, whereas the multi-phase clock signals CLK0-CLK13 each have a duty cycle of 50%. For example, the first branch 133 receives three of the seven parallel data input values D0-D2. The first output control signal provided at the first control input via the data path 192 is a logic level high for three clock cycles and a logic level low for four clock cycles. When the first control signal is a logic level high, the data values, D0-D2, from the first branch 133 are provided in order at the serial output as a result of the selections of the input and intermediate tiers, 103 and 105. The second branch 139 receives the remaining four of the seven parallel data input values D3-D6. The second output control signal provided at the second control input via the data path 194 is a logic level low for three clock cycles and a logic level high for four clock cycles, and is complementary to the first control signal. When the second control signal is a logic level high, the data values, D3-D6, from the second branch 139 are provided in order at the serial output as a result of the selections of the input and intermediate tiers, 103 and 105.

The selection circuit 101 of FIG. 1 does not suffer from the high complexity, bandwidth limitations, high power consumption, and low jitter requirements that may occur in other implementations. For example, a latch implementation may consume more power than the selection circuit 101 because latches can require a clock that is N times faster than the incoming data, where N is the number of parallel inputs. Also, a latch implementation can be bandwidth limiting because it requires relatively long setup and hold times and a low jitter clock. Conventional implementations that do not use latches may only be able to process parallel inputs where the number of inputs are powers of two or may be bandwidth limited and may suffer from high power consumption because of a heavily loaded output. The selection circuit 101 provides a latch-free implementation that reduces circuit complexity by using the same, or similar, combinational logic circuits throughout the selection circuit 101 and is capable of processing an odd number of inputs and an even number of inputs that is not a power of two. The selection circuit 101 may also consume less power and have a higher bandwidth and more favorable jitter requirements than implementations that use latches or heavily loaded outputs.

Figure 2:
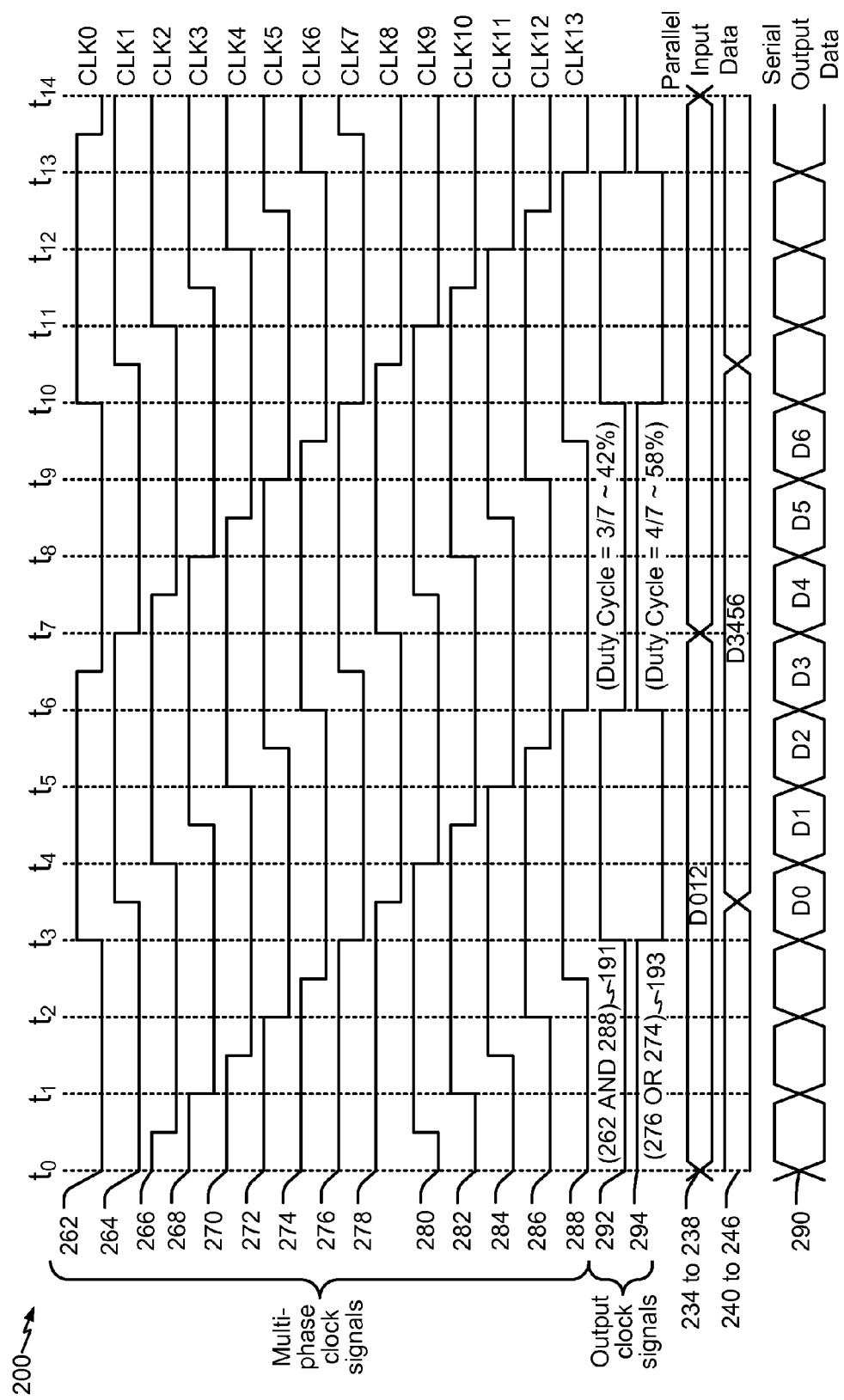
FIG. 2 is a waveform diagram of a particular illustrative embodiment depicting timing related to operating an apparatus with a selection circuit having a tree structure to serialize parallel data input values.

Referring to FIG. 2, a waveform diagram is illustrated and generally designated 200. The waveform diagram 200 illustrates waveforms that may be used during operation of apparatus 100. The waveform diagram 200 includes waveforms for multi-phase clock signals 262, 264, 266, 268, 270, 272, 274, 276, 278, 280, 282, 284, 286, and 288, where the multi-phase clock signal 262 corresponds to the CLK0 clock signal of FIG. 1, the multi-phase clock signal 264 corresponds to the CLK1 clock signal, the multi-phase clock signal 266 corresponds to the CLK2 clock signal, the multi-phase clock signal 268 corresponds to the CLK3 clock signal, the multi-phase clock signal 270 corresponds to the CLK4 clock signal, the multi-phase clock signal 272 corresponds to the CLK5 clock signal, the multi-phase clock signal 274 corresponds to the CLK6 clock signal, the multi-phase clock signal 276 corresponds to the CLK7 clock signal, the multi-phase clock signal 278 corresponds to the CLK8 clock signal, the multi-phase clock signal 280 corresponds to the CLK9 clock signal, the multi-phase clock signal 282 corresponds to the CLK10 clock signal, the multi-phase clock signal 284 corresponds to the CLK11 clock signal, the multi-phase clock signal 286 corresponds to the CLK12 clock signal, and the multi-phase clock signal 288 corresponds to the CLK13 clock signal.

The waveform diagram 200 includes waveforms for output clock signals 292 and 294, where the output clock signal 292 corresponds to the first signal whose delayed version is provided to the root selection element 128 of FIG. 1 via the data path 192 and the output clock signal 294 corresponds to the second signal whose delayed version provided to the root selection element 128 via the data path 194.

The waveform diagram 200 includes parallel input data values 234, 236, 238, 240, 242, 244, and 246, received in parallel at the parallel interface 102 of FIG. 1. The parallel data input value 234 corresponds to data input value D0 received at the interface input 134, the parallel data input value 236 corresponds to data input value D1 received at the interface input 136, the parallel data input value 238 corresponds to data input value D2 received at the interface input 138, the parallel data input value 240 corresponds to data input value D3 received at the interface input 140, the parallel data input value 242 corresponds to data input value D4 received at the interface input 142, the parallel data input value 244 corresponds to data input value D5 received at the interface input 144, and the parallel data input value 246 corresponds to data input value D6 received at the interface input 146.

The waveform diagram 200 also includes serial output data values 290, where the serial output data values correspond to the serial output data provided by the root selection element 128 of FIG. 1 at the data path 190.

As illustrated in FIG. 2, each of the multi-phase clock signals has a phase that is different from the other multi-phase clock signals. The multi-phase clock signals may be generated using a phase locked loop (PLL), a delay locked loop (DLL), a clock divider, or by any other mechanism for generating multi-phase clock signals. The PLL may use a ring oscillator as a voltage controlled oscillator component. In an illustrative embodiment, each of the multi-phase clock signals has a duty cycle (i.e., a percentage of a signal's period during which the signal has a logical high value) of approximately fifty percent (50%). Alternatively, the multi-phase clock signals may have an uneven duty cycle. For example, some of the clock signals may have a duty cycle greater than 50% while others (e.g., their complements) may have a duty cycle less than 50%.

At the input tier 103 of FIG. 1, the multi-phase clock signal 280 (CLK9) is applied at the data path 180 and the multi-phase clock signal 266 (CLK2) is applied at the data path 166 of the combinatorial gate multiplexer 104. The multi-phase clock signals 280 and 266 are complementary (e.g., when one of the multi-phase clock signals is high the other is low). The multi-phase clock signal 288 (CLK13) is applied at the data path 188 and the multi-phase clock signal 274 (CLK6) is applied at the data path 174 of the combinatorial gate multiplexer 106. The multi-phase clock signals 288 and 274 are complementary. The multi-phase clock signal 264 (CLK1) is applied at the data path 164 and the multi-phase clock signal 278 (CLK8) is applied at the data path 178 of the combinatorial gate multiplexer 108. The multi-phase clock signals 264 and 278 are complementary. The multi-phase clock signal 272 (CLK5) is applied at the data path 172 and the multi-phase clock signal 286 (CLK12) is applied at the data path 186 of the combinatorial gate multiplexer 110. The multi-phase clock signals 272 and 286 are complementary.

At the intermediate tier 105 of FIG. 1, the multi-phase clock signal 284 (CLK11) is applied at the data path 184 of the combinatorial gate multiplexer 112 and the multi-phase clock signal 270 (CLK4) is applied at the data path 170 of the combinatorial gate multiplexer 114. The multi-phase clock signals 284 and 270 are complementary. A delayed version of the multi-phase clock signal 284 is provided from the output of the combinatorial gate multiplexer 112 to the control input S1 of the combinatorial gate multiplexer 120. A delayed version of the multi-phase clock signal 270 is provided from the output of the combinatorial gate multiplexer 114 to the control input S0 of the combinatorial gate multiplexer 120.

The multi-phase clock signal 268 (CLK3) is applied at the data path 168 of the combinatorial gate multiplexer 116 and the multi-phase clock signal 282 (CLK10) is applied at the data path 182 of the combinatorial gate multiplexer 118. The multi-phase clock signals 268 and 282 are complementary. A delayed version of the multi-phase clock signal 268 is provided from the output of the combinatorial gate multiplexer 116 to the control input S1 of the combinatorial gate multiplexer 122. A delayed version of the multi-phase clock signal 282 is provided from the output of the combinatorial gate multiplexer 118 to the control input S0 of the combinatorial gate multiplexer 122.

At the output tier 107 of FIG. 1, the multi-phase clock signal 262 (CLK0) is applied at the data path 162 and the multi-phase clock signal 288 (CLK13) is applied at the data path 188 of the combinatorial gate multiplexer 124. In an illustrative embodiment, the combinatorial gate multiplexer 124 provides an AND operation with the multi-phase clock signals 262 (CLK0) and 288 (CLK13) to generate the first signal corresponding to an output clock signal 292 to the combinatorial gate multiplexer 126 via the data path 191. The combinatorial gate multiplexer 126 may be configured to provide a delayed version of the output clock signal 292 as the delayed first signal to the combinatorial gate multiplexer 128 via the data path 192.

The multi-phase clock signal 274 (CLK6) is applied at the data path 174 and the multi-phase clock signal 276 (CLK7) is applied at the data path 176 of the combinatorial gate multiplexer 132. In an illustrative embodiment, the combinatorial gate multiplexer 132 provides an OR operation with the multi-phase clock signals 274 (CLK6) and 276 (CLK7) to generate the second signal corresponding to an output clock signal 294 to the combinatorial gate multiplexer 132 via the data path 193. The combinatorial gate multiplexer 130 may be configured to provide a delayed version of the output clock signal 294 provided as the delayed second signal to the combinatorial gate multiplexer 128 via the data path 194.

The output clock signal 292 may have a duty cycle that depends on the number of parallel data input values, where the number of parallel data input values may be an odd number or an even number that is not a power of two. For example, the number of parallel data input values may be seven and the duty cycle of the output clock signal 292 may be three sevenths (3/7) or approximately forty-two percent (42%). The output clock signal 294 may also have a duty cycle that depends on the number of parallel data input values. Continuing with the previous example, the number of parallel data input values may be seven and the duty cycle of the output clock signal 294 may be four sevenths (4/7) or approximately forty-two percent (58%).

The output clock signals 292 and 294 may be complementary, as illustrated in FIG. 2, and have periods based on the number of parallel data input values. The output clock signals 292 and 294 enable data selection at the combinatorial gate multiplexer 128 for an arbitrary number of inputs, and may be generated using the same circuitry as the rest of the circuits in the selection circuit 101. Utilizing the same circuitry for the all of the circuits in the selection circuit 101 may reduce manufacturing costs and improve timing of the data and control signals by reducing disparity between delays in the selection circuit 101.

In an illustrative embodiment, the parallel data input values D0-D6 may be provided as serial data output values 290 in the same order, D0-D6, as illustrated in FIG. 2. Alternatively, the order of the serial data output values 290 may be reversed, D6-D0, or provided in a mixed pattern. The order of the serial data output values 290 may be controlled by the multi-phase output clock signals CLK0-CLK13. As illustrated in FIG. 2, the selection of the parallel data input values D0-D2 from the first branch 133 commences at time t3 when output clock signal 292 transitions to a logic high (i.e., a voltage corresponding to a logic high value) and ends at time t6 when the output clock signal 292 transitions to a logic low (i.e., a voltage corresponding to a logic low value). The data input value D0 is provided as the serial data output at the data path 190 between times t3-t4 when the multi-phase clock signal 280 (CLK9) is a logic high at the combinatorial gate multiplexer 104 of FIG. 1 and the delayed version of the multi-phase clock signal 284 (CLK11) is a logic high at the combinatorial gate multiplexer 120.

The data input value D1 is provided at the serial data output between times t4-t5 when the multi-phase clock signal 266 (CLK2) is a logic high at the combinatorial gate multiplexer 104 and the delayed version of the multi-phase clock signal 284 (CLK11) is a logic high at the combinatorial gate multiplexer 120. The data input value D2 is provided as the serial data output of the data path 190 between times t5-t6 when the multi-phase clock signal 288 (CLK13) is a logic high at the combinatorial gate multiplexer 106 and the delayed version of the multi-phase clock signal 270 (CLK4) is a logic high at the combinatorial gate multiplexer 120. Selection of the parallel data input values D3-D6 from the second branch 139 commences at time t6 when the output clock signal 294 transitions to a logic high and ends at time t10 when the output clock signal 294 transitions to a logic low. The data input value D3 is provided as the serial data output of the data path 190 between times t6-t7 when the multi-phase clock signal 264 (CLK1) is a logic high at the combinatorial gate multiplexer 108 and the delayed version of the multi-phase clock signal 268 (CLK3) is a logic high at the combinatorial gate multiplexer 122. The data input value D4 is provided as the serial data output of the data path 190 between times t7-t8 when the multi-phase clock signal 278 (CLK8) is a logic high at the combinatorial gate multiplexer 108 and the delayed version of the multi-phase clock signal 268 (CLK3) is a logic high at the combinatorial gate multiplexer 122. The data input value D5 is provided as the serial data output of the data path 190 between times t8-t9 when the multi-phase clock signal 272 (CLK5) is a logic high at the combinatorial gate multiplexer 110 and the delayed version of the multi-phase clock signal 282 (CLK10) is a logic high at the combinatorial gate multiplexer 122. The data input value D6 is provided as the serial data output of the data path 190 between times t9-t10 when the multi-phase clock signal 286 (CLK12) is a logic high at the combinatorial gate multiplexer 110 and the delayed version of the multi-phase clock signal 282 (CLK10) is a logic high at the combinatorial gate multiplexer 122.

The waveforms of FIG. 2 do not illustrate signal delays associated with the selection circuit 101 of FIG. 1. The combinatorial gate multiplexers 104, 106, 108, and 110 each have an associated delay that may be approximately equal if the same circuit structure is used for each combinatorial gate multiplexer 104-110 in the input tier 103. To avoid having the multi-phase clock signals 284, 270, 268, and 282 applied to the intermediate tier 105 arrive at the combinatorial gate multiplexers 120 and 122 before the intermediate data values, the combinatorial gate multiplexers 112, 114, 116, and 118 may operate as delay elements. The delays provided by the delay elements (e.g., the combinatorial gate multiplexers 112-118) in the intermediate tier 105 may be closely matched to the delays of the input tier 103 by using the same circuit structure for each combinatorial gate multiplexer 112-122 in the intermediate tier 105 as is used in the input tier 103. The combinatorial gate multiplexers 120 and 122 increase the delay to the propagating data values that are carried over to the output tier 107. To further synchronize transitions in the output tier 107, the combinatorial gate multiplexers 124, 126, 130, and 132 may operate as delay elements. The delays provided by the delay elements (e.g., the combinatorial gate multiplexers 124, 126, 130, 132) in the output tier 107 may be closely matched to the delays to the data values caused in the input and intermediate tiers, 103 and 105, by using the same circuit structure for each combinatorial gate multiplexer 124-128 in the output tier 107 as is used in the input tier 103 and the intermediate tier 105. By providing the delay elements for the control signals at the intermediate and output tiers, 105 and 107, the selection circuit 101 may provide improved transition synchronization throughout the selection circuit 101.

Figure 3:
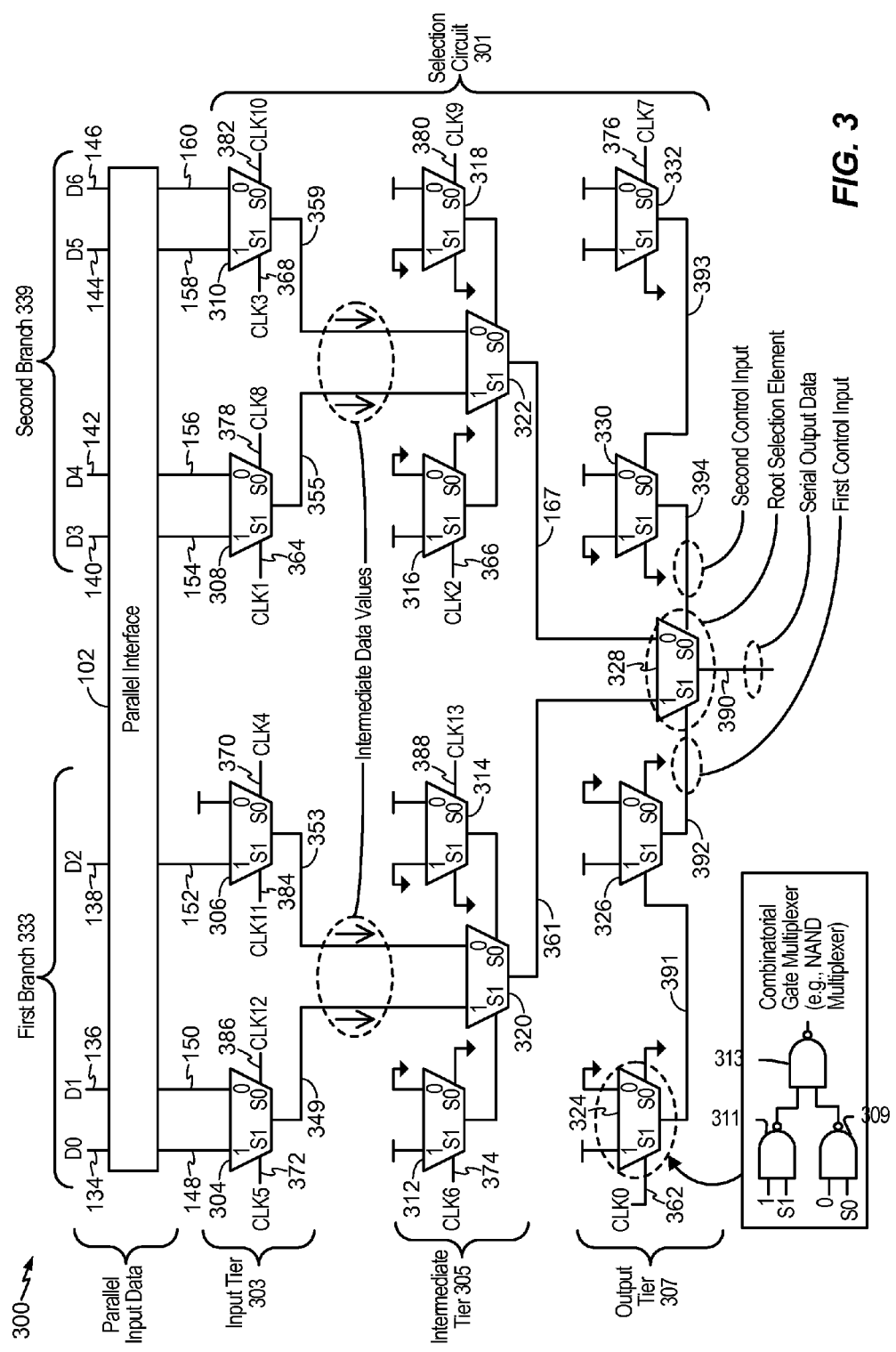
FIG. 3 is a diagram of a second particular illustrative embodiment of an apparatus with a selection circuit having a tree structure that can be used to serialize parallel data input values.

Referring to FIG. 3, a particular illustrative embodiment of an apparatus with a selection circuit having a tree structure that can be used to serialize parallel data input values is depicted and generally designated 300. The apparatus 300 includes a parallel interface 102 and a selection circuit 301 having multiple combinatorial gate multiplexers. The multiple combinatorial gate multiplexers may be grouped into multiple tiers, such as an input tier 303, an intermediate tier 305, and an output tier 307. The multiple combinatorial gate multiplexers may serve as selection elements, delay elements, logic operation elements, or any combination thereof. The combinatorial gate multiplexers may be latch-free circuits.

In an illustrative embodiment, each of the combinatorial gate multiplexers of the apparatus 300 has the same internal logic configuration. In an illustrative embodiment, one or more of the multiple combinatorial gate multiplexers may be a NAND multiplexer having three two-input NAND gates, in which a first NAND gate 109 has an input 0 and a control input S0 and a second NAND gate 111 has an input 1 and a control input S1. Outputs of the first NAND gate 109 and the second NAND gate 111 are provided to a third NAND gate 113, whose output is the output of the NAND multiplexer.

The parallel interface 102 may be configured to receive parallel data input values D0-D6 and generate output values as described in FIG. 1. The input tier 303 may include an input set of selection elements, such as combinatorial gate multiplexers 304, 306, 308, and 310. The combinatorial gate multiplexer 304 may be configured to receive the data input value D0 via a data path 148 and to receive the data input value D1 via a data path 150. The combinatorial gate multiplexer 306 may be configured to receive the data input value D2 via a data path 152. The combinatorial gate multiplexer 308 may be configured to receive the data input value D3 via a data path 154 and to receive the data input value D4 via a data path 156. The combinatorial gate multiplexer 310 may be configured to receive the data input value D5 via a data path 158 and to receive the data input value D6 via a data path 160.

The combinatorial gate multiplexers in the input tier 303 also receive clock signals at control inputs to determine which data input values are passed to the next tier. For example, the combinatorial gate multiplexer 304 receives a CLK5 clock signal via a data path 372 and a CLK12 clock signal via a data path 386. The combinatorial gate multiplexer 306 receives a CLK11 clock signal via a data path 384 and a CLK4 clock signal via a data path 370. The combinatorial gate multiplexer 308 receives a CLK1 clock signal via a data path 364 and a CLK8 clock signal via a data path 378. The combinatorial gate multiplexer 310 receives a CLK3 clock signal via a data path 368 and a CLK10 clock signal via a data path 382.

The selected data input value at the combinatorial gate multiplexer 304 is passed as an intermediate data value to a combinatorial gate multiplexer 320 of the intermediate tier 305 via a data path 349. The selected data input value at the combinatorial gate multiplexer 306 is passed as an intermediate data value to the combinatorial gate multiplexer 320 of the intermediate tier 305 via a data path 353. The selected data input value at the combinatorial gate multiplexer 308 is passed as an intermediate data value to a combinatorial gate multiplexer 322 of the intermediate tier 305 via a data path 355. The selected data input value at the combinatorial gate multiplexer 310 is passed as an intermediate data value to the combinatorial gate multiplexer 322 of the intermediate tier 305 via a data path 359.

The intermediate tier 305 includes multiple combinatorial gate multiplexers, including a combinatorial gate multiplexer 312, a combinatorial gate multiplexer 314, a combinatorial gate multiplexer 316, a combinatorial gate multiplexer 318, the combinatorial gate multiplexer 320, and the combinatorial gate multiplexer 322. The combinatorial gate multiplexers 312, 314, 316, and 318 may be configured to operate as delay elements and the combinatorial gate multiplexers 320 and 322 may be configured to operate as selection elements. An input 0 and its corresponding control input S0 of the combinatorial gate multiplexer 312 are tied to a low voltage potential, such as ground or a negative supply voltage VSS. An input 1 of the combinatorial gate multiplexer 312 is tied to a high voltage potential, such as a positive power supply voltage VDD, and its corresponding control input S1 receives a CLK6 clock signal via a data path 374. The output of the combinatorial gate multiplexer 312 is provided to a control input S1 of the combinatorial gate multiplexer 320 as a delayed version of the CLK6 clock signal.

An input 1 and its corresponding control input S1 of the combinatorial gate multiplexer 314 are tied to a low voltage potential, such as ground or a negative supply voltage VSS. An input 0 of the combinatorial gate multiplexer 314 is tied to a high voltage potential, such as a positive power supply voltage VDD, and its corresponding control input S0 receives a CLK13 clock signal via a data path 388. The output of the combinatorial gate multiplexer 314 is provided to a control input S0 of the combinatorial gate multiplexer 320 as a delayed version of the CLK13 clock signal.

An input 0 and its corresponding control input S0 of the combinatorial gate multiplexer 316 are tied to a low voltage potential, such as ground or a negative supply voltage VSS. An input 1 of the combinatorial gate multiplexer 316 is tied to a high voltage potential, such as a positive power supply voltage VDD, and its corresponding control input S1 receives a CLK2 clock signal via a data path 366. The output of the combinatorial gate multiplexer 316 is provided to a control input S1 of the combinatorial gate multiplexer 322 as a delayed version of the CLK2 clock signal.

An input 1 and its corresponding control input S1 of the combinatorial gate multiplexer 318 are tied to a low voltage potential, such as ground or a negative supply voltage VSS. An input 0 of the combinatorial gate multiplexer 318 is tied to a high voltage potential, such as a positive power supply voltage VDD, and its corresponding control input S0 receives a CLK9 clock signal via a data path 380. The output of the combinatorial gate multiplexer 318 is provided to a control input S0 of the combinatorial gate multiplexer 322 as a delayed version of the CLK9 clock signal.

The delayed version of the CLK6 clock signal and the delayed version of the CLK13 clock signal are provided to control inputs S1 and S0, respectively, of the combinatorial gate multiplexer 320 to determine which intermediate data value to pass through to the output tier 307 via a data path 361. The delayed version of the CLK2 clock signal and the delayed version of the CLK9 clock signal provided to control inputs S1 and S0, respectively, of the combinatorial gate multiplexer 322 determine which intermediate data value to pass through to the output tier 307 via a data path 367.

The output tier 307 includes multiple combinatorial gate multiplexers, including a combinatorial gate multiplexer 324, a combinatorial gate multiplexer 326, a combinatorial gate multiplexer 328, a combinatorial gate multiplexer 330, and a combinatorial gate multiplexer 332. The combinatorial gate multiplexers 324, 326, 330, and 332 may be configured to operate as delay elements and the combinatorial gate multiplexer 328 may be configured to operate as a selection element.

An input 0 and its corresponding control input S0 of the combinatorial gate multiplexer 324 are tied to a low voltage potential, such as ground or a negative supply voltage VSS. An input 1 of the combinatorial gate multiplexer 324 is tied to a high voltage potential, such as a positive power supply voltage VDD, and its corresponding control input S1 receives the CLK0 clock signal via the data path 362. The output of the combinatorial gate multiplexer 324 is provided to a control input S1 of the combinatorial gate multiplexer 326 as a first signal. The first signal is a delayed version of the CLK0 clock signal.

An input 0 and its corresponding control input S0 of the combinatorial gate multiplexer 326 are tied to a low voltage potential, such as ground or a negative supply voltage VSS. An input 1 of the combinatorial gate multiplexer 326 is tied to a high voltage potential, such as a positive power supply voltage VDD, and its corresponding control input S1 receives the first signal via a data path 391. The output of the combinatorial gate multiplexer 326 is provided to a first control input S1 of the combinatorial gate multiplexer 328 via a data path 392 as a delayed version of the first signal.

An input 0 of the combinatorial gate multiplexer 332 is tied to a high voltage potential, such as a positive power supply voltage VDD, and its corresponding control input S0 receives the CLK7 clock signal via the data path 376. An input 1 and its corresponding control input S1 of the combinatorial gate multiplexer 324 are tied to a low voltage potential, such as ground or a negative supply voltage VSS. The output of the combinatorial gate multiplexer 332 is provided to a control input S0 of the combinatorial gate multiplexer 330 as a second signal. The second signal is a delayed version of the CLK7 clock signal.

An input 1 and its corresponding control input S1 of the combinatorial gate multiplexer 330 are tied to a low voltage potential, such as ground or a negative supply voltage VSS. An input 0 of the combinatorial gate multiplexer 330 is tied to a high voltage potential, such as a positive power supply voltage VDD, and its corresponding control input S0 receives the second signal via a data path 393. The output of the combinatorial gate multiplexer 330 is provided to a second control input S0 of the combinatorial gate multiplexer 328 via a data path 394 as a delayed version of the second signal.

The combinatorial gate multiplexer 328 is a root selection element that selects between the data values provided by a first branch 333 and a second branch 339 of a tree structure based on the delayed first signal at the first control input S1 and the delayed second signal at the second control input S0. The intermediate data value provided by the selected branch is passed through the root selection element and provided as serial output data at a data path 390.

The selection circuit 301 may be configured to operate as a serializer by providing multi-phase clock signals to the selection circuit 301 in such a way that the appropriate data input value is selected at the serial output. A clock signal having an uneven duty cycle may be applied to a control input of at least one selection element of the selection circuit 301, such as the combinatorial gate multiplexer 328. As will be illustrated further in FIG. 4, the control signals provided to the root selection element 328 of the output tier 307 may have duty cycles that are complementary and match the number of parallel inputs provided to their respective branches. For example, the first branch 333 receives three of the seven parallel data input values D0-D2. The first output control signal provided at the first control input via the data path 392 is a logic level high for three clock cycles and a logic level low for four clock cycles. When the first control signal is a logic level high, the data values, D0-D2, from the first branch 333 are provided in order at the serial output as a result of the selections of the input and intermediate tiers, 303 and 305. The second branch 339 receives the remaining four of the seven parallel data input values D3-D6. The second output control signal provided at the second control input via the data path 394 is a logic level low for three clock cycles and a logic level high for four clock cycles, and is complementary to the first control signal. When the second control signal is a logic level high, the data values, D3-D6, from the second branch 339 are provided in order at the serial output as a result of the selections of the input and intermediate tiers, 303 and 305.

The selection circuit 301 of FIG. 3 does not suffer from the high complexity, bandwidth limitations, high power consumption, and low jitter requirements that may occur in other implementations. For example, a latch implementation may consume more power than the selection circuit 301 because latches can require a clock that is N times faster than the incoming data, where N is the number of parallel inputs. Also, a latch implementation can be bandwidth limiting because it requires relatively long setup and hold times and a low jitter clock. Conventional implementations that do not use latches may only be able to process parallel inputs where the number of inputs are powers of two or may be bandwidth limited and may suffer from high power consumption because of a heavily loaded output. The selection circuit 301 provides a latch-free implementation that reduces circuit complexity by using the same, or similar, combinational logic circuits throughout the selection circuit 301 and is capable of processing an odd number of inputs and an even number of inputs that is not a power of two. The selection circuit 301 may also consume less power and have a higher bandwidth and more favorable jitter requirements than implementations that use latches or heavily loaded outputs.

Figure 4:
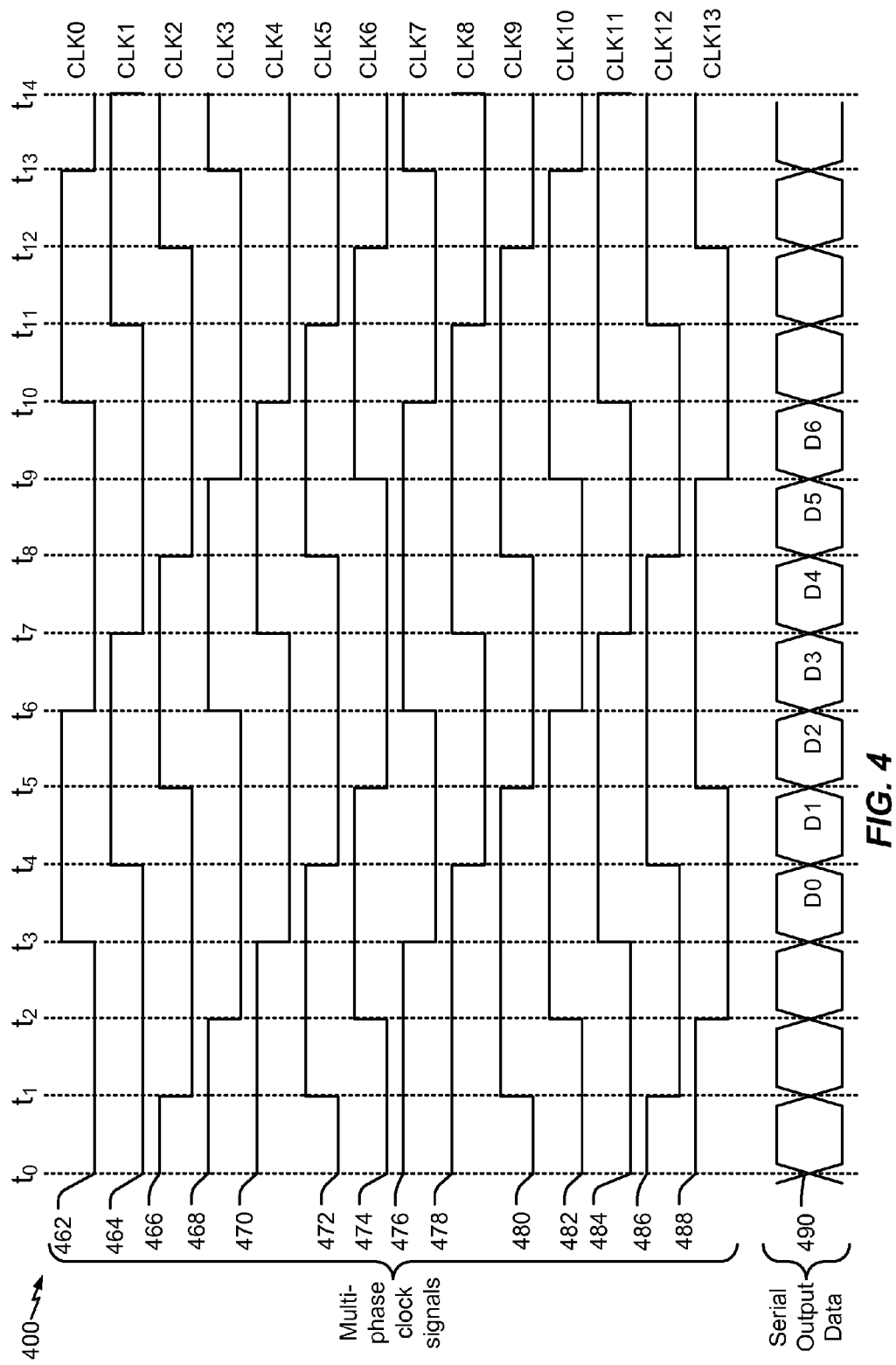
FIG. 4 is a waveform diagram of a second particular illustrative embodiment depicting timing related to operating an apparatus with a selection circuit having a tree structure to serialize parallel data input values.

Referring to FIG. 4, a waveform diagram is illustrated and generally designated 400. The waveform diagram 400 illustrates an operation of the apparatus 300 of FIG. 3. The waveform diagram 400 includes waveforms for multi-phase clock signals 462, 464, 466, 468, 470, 472, 474, 476, 478, 480, 482, 484, 486, and 488, where the multi-phase clock signal 462 corresponds to the CLK0 clock signal of FIG. 3, the multi-phase clock signal 464 corresponds to the CLK1 clock signal, the multi-phase clock signal 466 corresponds to the CLK2 clock signal, the multi-phase clock signal 468 corresponds to the CLK3 clock signal, the multi-phase clock signal 470 corresponds to the CLK4 clock signal, the multi-phase clock signal 472 corresponds to the CLK5 clock signal, the multi-phase clock signal 474 corresponds to the CLK6 clock signal, the multi-phase clock signal 476 corresponds to the CLK7 clock signal, the multi-phase clock signal 478 corresponds to the CLK8 clock signal, the multi-phase clock signal 480 corresponds to the CLK9 clock signal, the multi-phase clock signal 482 corresponds to the CLK10 clock signal, the multi-phase clock signal 484 corresponds to the CLK11 clock signal, the multi-phase clock signal 486 corresponds to the CLK12 clock signal, and the multi-phase clock signal 488 corresponds to the CLK13 clock signal.

The waveform diagram 400 also includes serial output data values 490, where the serial output data values correspond to the serial output data provided by the root selection element 328 of FIG. 3 at the data path 390.

As illustrated in FIG. 4, each of the multi-phase clock signals has a phase different from the other multi-phase clock signals. The multi-phase clock signals may be generated using a delay locked loop (DLL), a clock divider, or by any other mechanism for generating multi-phase clock signals that may have a duty cycle other than 50%. In an illustrative embodiment, each of the multi-phase clock signals has a duty cycle either less than or greater than fifty percent (50%). For example, one of the clock signals may have a duty cycle greater than 50% while its complement may have a duty cycle less than 50%. As illustrated for 7 inputs, each multi-phase clock signal has a period of seven time intervals (e.g., from time t0 to time t7), having a first value (e.g., logic low) for four time intervals and the other value (e.g., logic high) for three time intervals.

At the input tier 303 of FIG. 3, the multi-phase clock signal 472 (CLK5) is applied at the data path 372 and the multi-phase clock signal 486 (CLK12) is applied at the data path 386 of the combinatorial gate multiplexer 304. The multi-phase clock signals 472 and 486 are complementary (e.g., when one of the multi-phase clock signals is high the other is low). The multi-phase clock signal 484 (CLK11) is applied at the data path 384 and the multi-phase clock signal 470 (CLK4) is applied at the data path 370 of the combinatorial gate multiplexer 306. The multi-phase clock signals 484 and 470 are complementary. The multi-phase clock signal 464 (CLK1) is applied at the data path 364 and the multi-phase clock signal 478 (CLK8) is applied at the data path 378 of the combinatorial gate multiplexer 308. The multi-phase clock signals 464 and 478 are complementary. The multi-phase clock signal 468 (CLK3) is applied at the data path 368 and the multi-phase clock signal 482 (CLK10) is applied at the data path 382 of the combinatorial gate multiplexer 310. The multi-phase clock signals 468 and 482 are complementary.

At the intermediate tier 305 of FIG. 3, the multi-phase clock signal 474 (CLK6) is applied at the data path 374 of the combinatorial gate multiplexer 312 and the multi-phase clock signal 488 (CLK13) is applied at the data path 388 of the combinatorial gate multiplexer 314. The multi-phase clock signals 474 and 488 are complementary. A delayed version of the multi-phase clock signal 474 is provided from the output of the combinatorial gate multiplexer 312 to the control input S1 of the combinatorial gate multiplexer 320. A delayed version of the multi-phase clock signal 488 is provided from the output of the combinatorial gate multiplexer 314 to the control input S0 of the combinatorial gate multiplexer 320.

The multi-phase clock signal 466 (CLK2) is applied at the data path 366 of the combinatorial gate multiplexer 316 and the multi-phase clock signal 480 (CLK9) is applied at the data path 380 of the combinatorial gate multiplexer 318. The multi-phase clock signals 466 and 480 are complementary. A delayed version of the multi-phase clock signal 466 is provided from the output of the combinatorial gate multiplexer 316 to the control input S1 of the combinatorial gate multiplexer 322. A delayed version of the multi-phase clock signal 480 is provided from the output of the combinatorial gate multiplexer 318 to the control input S0 of the combinatorial gate multiplexer 322.

At the output tier 307 of FIG. 3, the multi-phase clock signal 462 (CLK0) is applied at the data path 362 of the combinatorial gate multiplexer 324. The combinatorial gate multiplexer 324 provides a delayed version of the multi-phase clock signal 462 (CLK0) as a first signal to the combinatorial gate multiplexer 326 via the data path 391. The combinatorial gate multiplexer 326 may be configured to provide a delayed version of the first signal as the first control signal to the combinatorial gate multiplexer 328 via the data path 392. The multi-phase clock signal 462 (CLK0) may have a duty cycle that depends on the number of parallel data input values (e.g., D0-D6), where the number of parallel data input values may be a power of two or alternatively may be an odd number or an even number that is not a power of two. For example, the number of parallel data input values may be seven and the duty cycle of the multi-phase clock signal 462 (CLK0) may be three sevenths (3/7) or approximately forty-two percent (42%).

The multi-phase clock signal 476 (CLK7) is applied at the data path 376 of the combinatorial gate multiplexer 332. The combinatorial gate multiplexer 332 may be configured to provide a delayed version of the multi-phase clock signal 476 (CLK7) as a second signal to the combinational gate multiplexer 330 via the data path 393. The combinatorial gate multiplexer 330 may be configured to provide a delayed version of the second signal as the second control signal to the combinatorial gate multiplexer 328 via the data path 394. The multi-phase clock signal 476 (CLK7) may also have a duty cycle that depends on the number of parallel data input values. For example, the number of parallel data input values may be seven and the duty cycle of the multi-phase clock signal 476 (CLK7) may be four sevenths (4/7) or approximately forty-two percent (58%). The multi-phase clock signals 462 (CLK0) and 476 (CLK7) may be complementary as illustrated in FIG. 4. In an illustrative embodiment, the clock signals 462, 464, 466, 468, 470, 472, and 474 may have duty cycles less than 50% (e.g., the duty cycles may be three sevenths (3/7) or approximately forty-two percent (42%)) and their complements, the clock signals 476, 478, 480, 482, 484, 486, and 488, may have duty cycles greater than 50% (e.g., the duty cycles may be four sevenths (4/7) or approximately fifty-eight percent (58%)).

In an illustrative embodiment, the parallel data input values D0-D6 may be provided as serial data output values 490 in the same order, D0-D6, as illustrated in FIG. 4. Alternatively, the order of the serial data output values 490 may be reversed, D6-D0, or provided in a mixed pattern. The order of the serial data output values 490 may be controlled by the multi-phase output clock signals CLK0-CLK13. As illustrated in FIG. 4, selection of the parallel data input values D0-D2 from the first branch 333 commences at time t3 when the multi-phase clock signal 462 (CLK0) transitions to a logic high and ends at time t6 when the multi-phase clock signal 462 (CLK0) transitions to a logic low. The data input value D0 is provided as the serial data output at the data path 390 between times t3-t4 when the multi-phase clock signal 472 (CLK5) is a logic high at the combinatorial gate multiplexer 304 of FIG. 3 and the delayed version of the multi-phase clock signal 474 (CLK6) is a logic high at the combinatorial gate multiplexer 320. The data input value D1 is provided as the serial data output at the data path 390 between times t4-t5 when the multi-phase clock signal 486 (CLK12) is a logic high at the combinatorial gate multiplexer 304 and the delayed version of the multi-phase clock signal 274 (CLK3) is a logic high at the combinatorial gate multiplexer 320. The data input value D2 is provided as the serial data output at the data path 390 between times t5-t6 when the multi-phase clock signal 484 (CLK11) is a logic high at the combinatorial gate multiplexer 306 and the delayed version of the multi-phase clock signal 488 (CLK13) is a logic high at the combinatorial gate multiplexer 320.

Selection of the parallel data input values D3-D6 from the second branch 339 commences at time t6 when the multi-phase clock signal 476 (CLK7) transitions to a logic high and ends at time t10 when the multi-phase clock signal 476 (CLK7) transitions to a logic low. The data input value D3 is provided as the serial data output between times t6-t7 when the multi-phase clock signal 464 (CLK1) is a logic high at the combinatorial gate multiplexer 308 and the delayed version of the multi-phase clock signal 466 (CLK2) is a logic high at the combinatorial gate multiplexer 322. The data input value D4 is provided as the serial data output at the data path 390 between times t7-t8 when the multi-phase clock signal 478 (CLK8) is a logic high at the combinatorial gate multiplexer 308 and the delayed version of the multi-phase clock signal 466 (CLK2) is a logic high at the combinatorial gate multiplexer 322. The data input value D5 is provided as the serial data output at the data path 390 between times t8-t9 when the multi-phase clock signal 468 (CLK3) is a logic high at the combinatorial gate multiplexer 310 and the delayed version of the multi-phase clock signal 480 (CLK9) is a logic high at the combinatorial gate multiplexer 322. The data input value D6 is provided as the serial data output at the data path 390 between times t9-t10 when the multi-phase clock signal 482 (CLK10) is a logic high at the combinatorial gate multiplexer 310 and the delayed version of the multi-phase clock signal 480 (CLK9) is a logic high at the combinatorial gate multiplexer 322.

The multi-phase clock signals 462-488 illustrated in FIG. 4 are provided with an uneven duty cycle whereas the multi-phase clock signals 262-288 illustrated in the FIG. 2 have a balanced duty cycle (e.g., a 50% duty cycle). Even though the multi-phase clock signals of FIGS. 2 and 4 have the same period, the multi-phase clock signals 462-488 of FIG. 4 will have transitions between logic levels at different times than the corresponding multi-phase clock signals 262-288 of FIG. 2. As a result, the application of the multi-phase clock signals 262-288 of FIG. 2 to the apparatus 100 of FIG. 1 may be applicable to a system using a PLL to generate multi-phase data signals, while application of the multi-phase clock signals 462-488 of FIG. 4 to the apparatus 300 of FIG. 3 may be applicable to a system using a DLL or clock divider to generate multi-phase clock signals.

Figure 5:
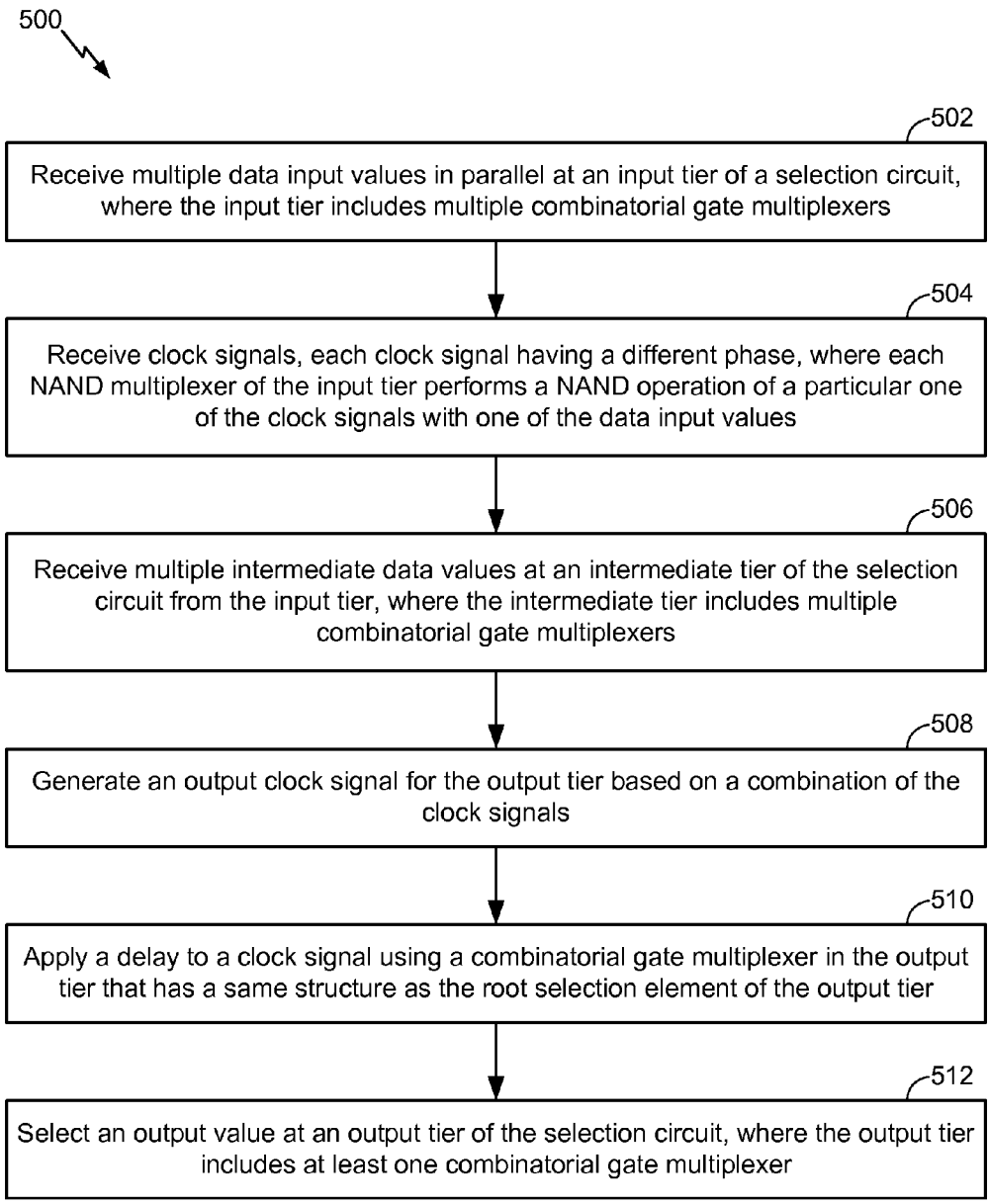
FIG. 5 is a flow chart of a particular illustrative embodiment of a method of serializing parallel data input values with a selection circuit having a tree structure.

Referring to FIG. 5, a particular embodiment of a method 500 is illustrated. The method 500 may include receiving multiple data input values in parallel at an input tier of a selection circuit, where the input tier includes multiple combinatorial gate multiplexers, at 502. For example, apparatus 100 of FIG. 1 includes the selection circuit 101 configured to receive data input values D0-D7 from the parallel interface 102. The parallel interface 102 may be configured to provide the data input values D0-D7 to the combinatorial gate multiplexers 104, 106, 108, and 110 of the input tier 103. One or more of the combinatorial gate multiplexers 104, 106, 108, and 110 may be a NAND multiplexer, such as the NAND multiplexer illustrated in FIG. 1.

The method 500 may further include receiving clock signals, each clock signal having a different phase, where each NAND multiplexer of the input tier performs a NAND operation of a particular one of the clock signals with one of the multiple data input values, at 504. For example, the combinatorial gate multiplexers 104, 106, 108, and 110 of the input tier 103 of FIG. 1 each receive two multi-phase clock signals where each of the multi-phase clock signals received at the input tier 103 has a different phase. The NAND multiplexers of the input tier 103 may perform a NAND operation of the received multi-phase clock signals and data input values. For example, in an embodiment where the combinatorial gate multiplexer 104 is a NAND multiplexer, the NAND gate 111 performs a NAND operation with the data input value D0 and the CLK9 clock signal, and the NAND gate 109 performs a NAND operation with the data input value D1 and the CLK2 clock signal. The NAND gate 113 performs a NAND operation with the results from the NAND gate 111 and the NAND gate 109. The output of the NAND gate 113 is provided to a next tier.

The method 500 may further include receiving multiple intermediate data values at an intermediate tier of the selection circuit from the input tier, where the intermediate tier includes multiple combinatorial gate multiplexers, at 506. For example, the outputs of the combinatorial gate multiplexers 104, 106, 108, and 110 of FIG. 1 may be provided as intermediate values to the intermediate tier 105. The intermediate tier 105 may include the combinatorial gate multiplexers 112, 114, 116, 118, 120, and 122.

The method 500 may further include generating an output clock signal for the output tier based on a combination of the clock signals, at 508. For example, the combinatorial gate multiplexer 124 of FIG. 1 may be a NAND multiplexer and may be configured to perform an AND operation with the CLK0 clock signal and the CLK13 clock signal. The combinatorial gate multiplexer 124 may be configured to receive the CLK0 clock signal at an input 1 via the data path 162 and to receive a CLK13 clock signal at a control input S1 via the data path 188, where an input 0 and its corresponding control input S0 are tied to a low logic level. The NAND gate 111 performs a NAND operation with the CLK0 clock signal and the CLK13 clock signal and provides the resulting output as an input to the NAND gate 113. The NAND gate 109 performs a NAND operation with two low logic level values and outputs a logic level high value to the NAND gate 113. The NAND gate 113 performs a NAND operation with the results from the NAND gate 111 and the logic level high value from the NAND gate 109. The first signal provided at the output of the NAND gate 113 is equivalent to an AND operation performed on the CLK0 clock signal and the CLK13 clock signal.

As another example, the combinatorial gate multiplexer 132 of FIG. 1 may be a NAND multiplexer and may be configured to perform an OR operation with the CLK6 clock signal and the CLK7 clock signal. The combinatorial gate multiplexer 132 may be configured to receive the CLK6 clock signal at a control input S0 via the data path 174 and a corresponding input 0 may be tied to a high logic level, such as a positive power supply voltage VDD. The NAND gate 109 performs a NAND operation with the CLK6 clock signal and the high logic level value and provides the resulting output as an input to the NAND gate 113. The combinatorial gate multiplexer 132 may be configured to receive the CLK7 clock signal at a control input S1 via the data path 176 and a corresponding input 1 may be tied to a high logic level. The NAND gate 111 performs a NAND operation with the CLK7 clock signal and the high logic level value and provides the resulting output as an input to the NAND gate 113. The NAND gate 113 performs a NAND operation with the results from the NAND gate 111 and the NAND gate 109. The second signal provided at the output of the NAND gate 113 is equivalent to an OR operation performed on the CLK6 clock signal and with the CLK7 clock signal.

The method 500 may further include applying a delay to a clock signal using a combinatorial gate multiplexer in the output tier that has a same structure as the root selection element of the output tier, at 510. For example, the combinatorial gate multiplexer 126 of FIG. 1 may be used to delay the first signal received via the data path 191 and to provide a delayed version of the first signal to the first control input of the combinatorial gate multiplexer 128. The combinatorial gate multiplexers 126 and 130 may introduce delays that substantially match delays introduced by the combinatorial gate multiplexers 120 and 122. Also, the combinatorial gate multiplexer 130 may be used to delay the second signal received via the data path 193 and to provide a delayed version of the second signal at the second control input of the combinatorial gate multiplexer 128. The combinatorial gate multiplexers 126 and 130 may have the same structure as the combinatorial gate multiplexer 128 and as the combinatorial gate multiplexers 120 and 122. For example, the combinatorial gate multiplexers 126, 128, and 130 may each be NAND multiplexers illustrated in FIG. 1. Further, combinatorial gate multiplexers 124 and 132 may have the same structure as the combinatorial gate multiplexer 128. Further still, each of the combinatorial gate multiplexers of the apparatus 100 may have the same structure as the combinatorial gate multiplexer 128.

The method 500 may further include selecting an output value at an output tier of the selection circuit, where the output tier includes at least one combinatorial gate multiplexer, at 512. For example, the combinational gate multiplexer 128 of FIG. 1 may be a root selection element configured to select an output value from the intermediate data values provided by the first branch 133 and the second branch 139.

The method 500 enables conversion of parallel data input values to serial output values in a fast and efficient manner. The method 500 may be used for any number of multiple parallel data inputs, including embodiments where the number of parallel data input values is an odd number, an even number that is not a power of two, an even number than is a power of two, or any combination thereof.

Figure 6:
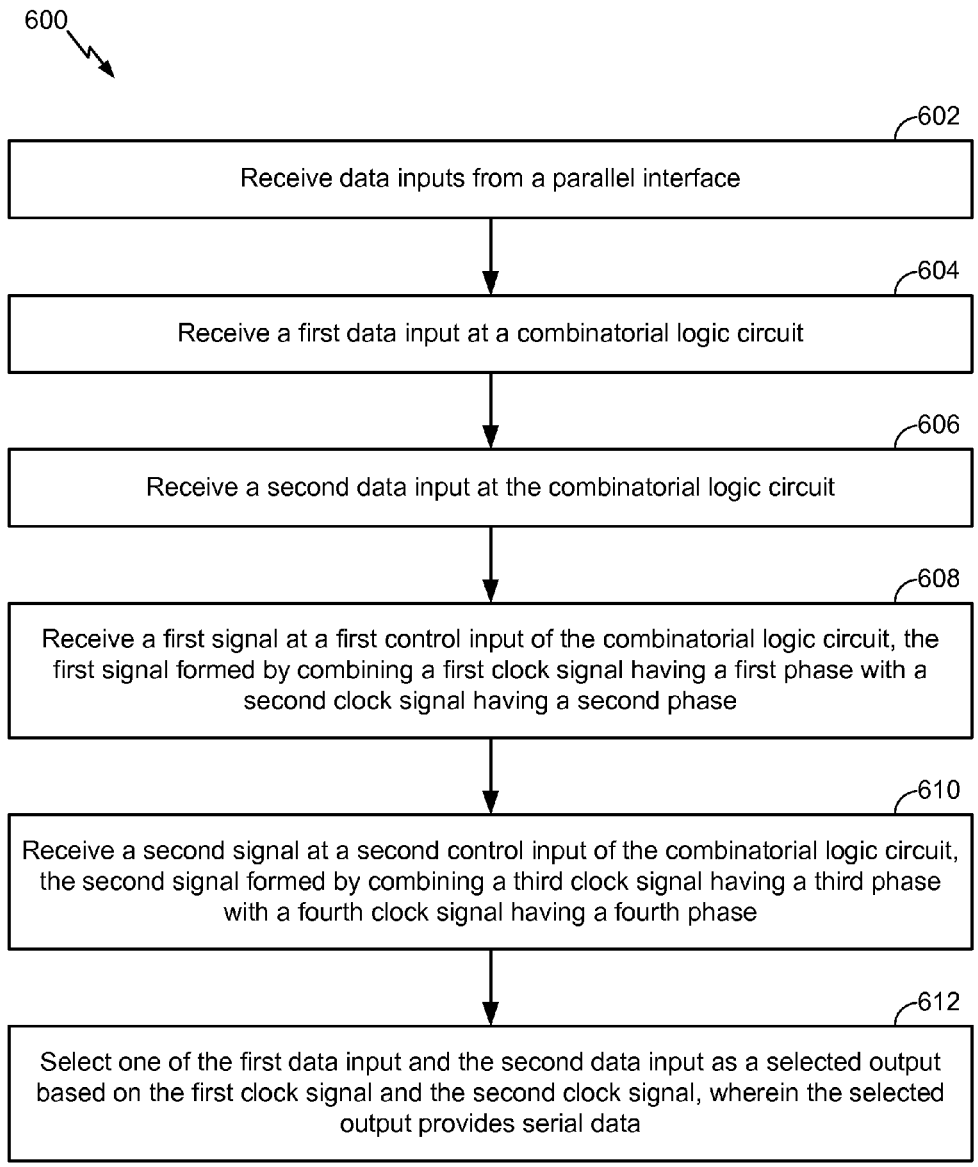
FIG. 6 is a flow chart of a second particular illustrative embodiment of a method of serializing parallel data input values with a selection circuit having a tree structure.

Referring to FIG. 6, a particular embodiment of a method 600 is illustrated. The method 600 may include receiving data inputs from a parallel interface, at 602. For example, the selection circuit 101 of FIG. 1 receives D0-D7 at the input tier 103 from the parallel interface 102.

The method 600 may further include receiving a first data input at a combinatorial logic circuit, at 604, and receiving a second data input at the combinatorial logic circuit, at 606. For example, the combinatorial gate multiplexer 128 of FIG. 1 may be configured to receive an intermediate data value passed through the combinatorial gate multiplexer 120 via the data path 161 as the first data input. The combinatorial gate multiplexer 128 may be configured to receive another intermediate data value passed through the combinatorial gate multiplexer 122 via the data path 167 as the second data input.

The method 600 may further include receiving a first signal at a first control input of the combinatorial logic circuit, the first signal formed by combining a first clock signal having a first phase with a second clock signal having a second phase, at 608. For example, the combinatorial gate multiplexer 128 of FIG. 1 may be configured to receive the delayed version of the first signal at the first control input from the combinatorial gate multiplexer 126 via the data path 192. The first signal may be formed at the combinatorial gate multiplexer 124 by combining the CLK0 clock signal at the data path 162 and the CLK13 clock signal at the data path 188. As illustrated in FIG. 2 the multi-phase clock signals 262 (CLK0) and 288 (CLK13) have different phases. The combination of the multi-phase clock signals 262 (CLK0) and 288 (CLK13) may result in the output clock signal 292 provided to the combinatorial gate multiplexer 126 via the data path 191 and to the combinatorial gate multiplexer 128 via the data path 192.

The method 600 may further include receiving a second signal at a second control input of the combinatorial logic circuit, the second signal formed by combining a third clock signal having a third phase with a fourth clock signal having a fourth phase, at 610. For example, the combinatorial gate multiplexer 128 of FIG. 1 may be configured to receive the delayed version of the second signal at the second control input from the combinatorial gate multiplexer 130 via the data path 194. The second signal may be formed by combining the CLK6 clock signal at the data path 174 and the CLK7 clock signal at the data path 176 of the combinatorial multiplexer 132. As illustrated in FIG. 2, the multi-phase clock signals 274 (CLK6) and 276 (CLK7) have different phases. The combination of the multi-phase clock signals 274 (CLK6) and 276 (CLK7) may result in the output clock signal 294 provided to the combinatorial gate multiplexer 130 via the data path 193 and to the combinatorial gate multiplexer 128.

The method 600 may further include selecting one of the first data input and the second data input as a selected output based on the first signal and the second signal, where the selected output provides serial data, at 612. For example, the combinatorial gate multiplexer 128 of FIG. 1 may be a root selection element configured to select between the intermediate data values provided by the first branch 133 via the data path 161 and the second branch 139 via the data path 167, where the selection is based on the delayed version of the first signal received via the data path 192 and the delayed version of the second signal received via the data path 194.

Figure 7:
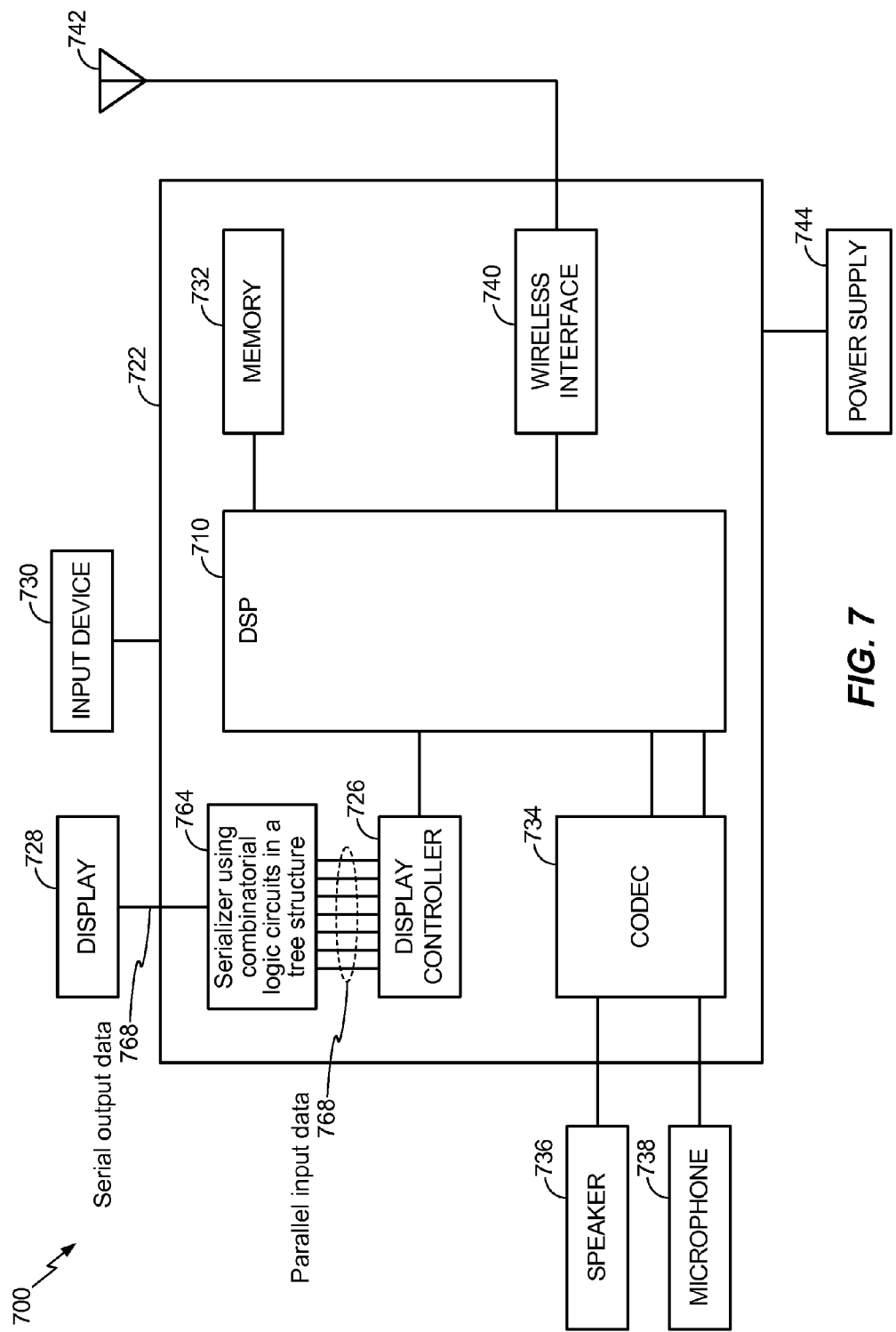
FIG. 7 is a block diagram of a portable device including an apparatus with logic circuits in a tree structure to serialize parallel data input values.

Referring to FIG. 7, a block diagram of a particular illustrative embodiment of an electronic device is depicted and generally designated 700. The device 700 includes a processor, such as a digital signal processor (DSP) 710, coupled to a memory 732 and a serializer using combinatorial logic circuits in a tree structure 764. In an illustrative example, the serializer using combinatorial logic circuits in a tree structure 764 includes the multiple combinatorial gate multiplexers depicted in FIG. 1. To illustrate, the serializer using the combinatorial logic circuits in a tree structure 764 may include the apparatus 100 of FIG. 1 or the apparatus 300 of FIG. 3, may operate according to one or more of the methods of FIGS. 5 and 6, or any combination thereof.

FIG. 7 also shows a display controller 726 that is coupled to the digital signal processor 710 and to the serializer using combinatorial logic circuits in a tree structure 764. The display controller 726 provides parallel data input values to the serializer using combinatorial logic circuits in a tree structure 764 and the serializer using combinatorial logic circuits in a tree structure 764 converts the parallel data input values into serial data output values and provides the serial data output values to a display 728. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, the DSP 710, the display controller 726, the memory 732, the CODEC 734, the wireless controller 740, and the serializer using combinatorial logic circuits in a tree structure 764 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

Figure 8:
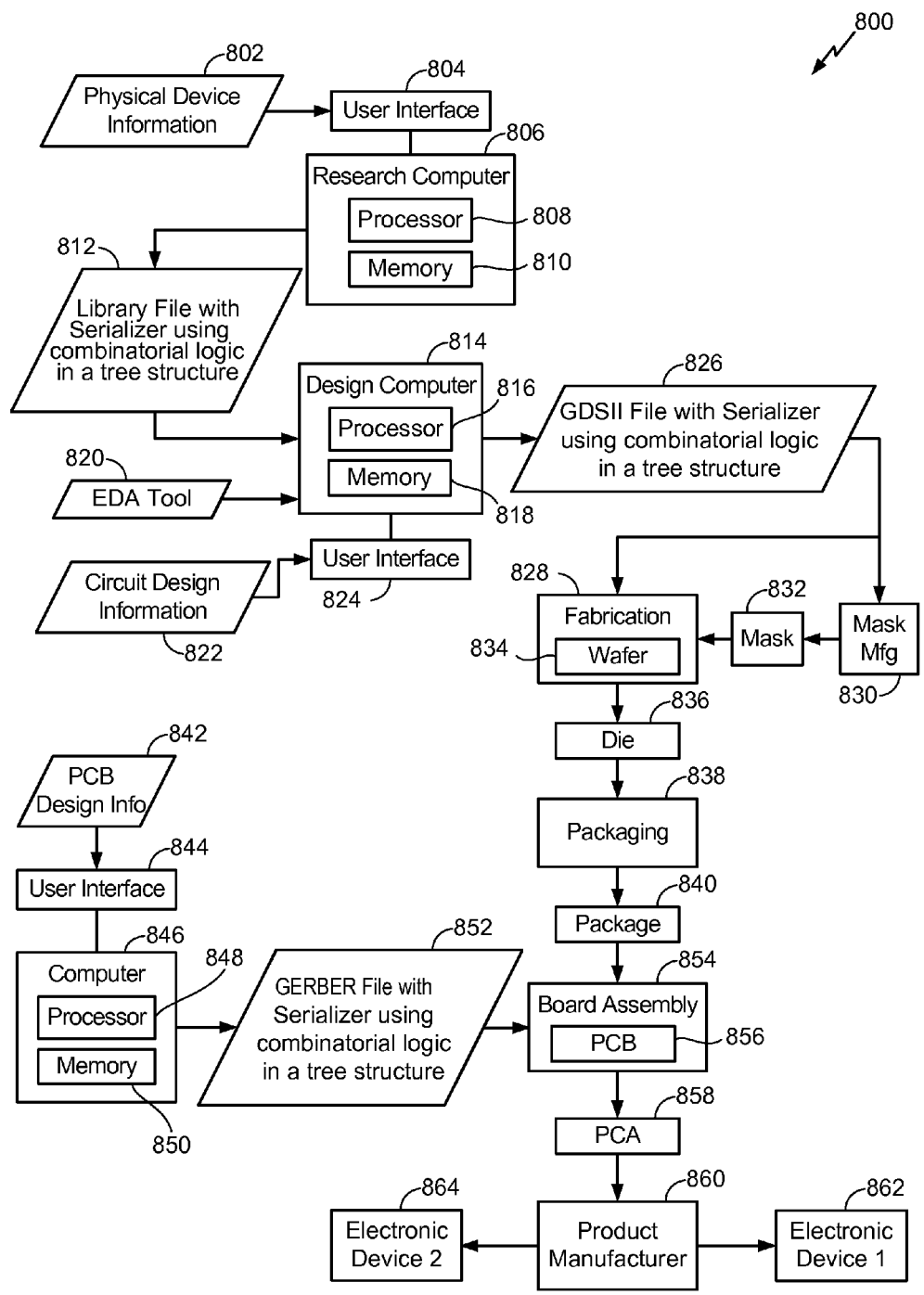
FIG. 8 is a data flow diagram illustrating a manufacturing process for use with an apparatus with logic in a tree structure to serialize parallel data input values.

FIG. 8 is a data flow diagram of a particular illustrative embodiment of a manufacturing process to manufacture electronic devices that include a serializer using combinatorial logic in a tree structure.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as the apparatus 100 of FIG. 1, the apparatus 300 of FIG. 3, or any combination thereof. To illustrate, the physical device information 802 may include information corresponding the multiple combinatorial gate multiplexers of FIG. 1 or 3 in a tree structure. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including transformed design information. For example, the library file 812 may include a library of semiconductor devices including the apparatus 100 of FIG. 1, the apparatus 300 of FIG. 3, or any combination thereof, that is provided for use with an electronic design automation (EDA) tool 820. To illustrate, the library file 812 may include information corresponding to the multiple combinatorial gate multiplexers of FIG. 1 or 3 in a tree structure.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit using the apparatus 100 of FIG. 1, the apparatus 300 of FIG. 3, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as the apparatus 100 of FIG. 1, the apparatus 300 of FIG. 3, or any combination thereof. To illustrate, the circuit design information may include identification of particular circuits and relationships to other elements in a circuit design, positioning information, feature size information, interconnection information, or other information representing a physical property of a semiconductor device.

The design computer 814 may be configured to transform the design information, including the circuit design information 822 to comply with a file format. To illustrate, file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the apparatus 100 of FIG. 1, the apparatus 300 of FIG. 3, or any combination thereof, in addition to other circuits or information. To illustrate, the GDSII file 826 may include information corresponding the multiple combinatorial gate multiplexers of FIG. 1 or 3 in a tree structure. To illustrate, the data file may include information corresponding to a system-on-chip (SOC) that includes the multiple combinatorial gate multiplexers of FIG. 1 or 3 in a tree structure and that also includes additional electronic circuits and components within the SOC.

The GDSII file 826 may be received at a fabrication process 828 to manufacture the apparatus 100 of FIG. 1, the apparatus 300 of FIG.3, or any combination thereof, according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 includes a circuit including the apparatus 100 of FIG. 1, the apparatus 300 of FIG. 3, or any combination thereof. To illustrate, the representative die 836 may include information corresponding to a parallel interface 102 and the multiple combinatorial gate multiplexers of FIG. 1 or 3.

In an illustrative embodiment, the fabrication process 828 includes an apparatus to convert the parallel data input values to serial data output values using combinatorial logic circuits in a tree structure that may include the parallel interface 102 and the multiple combinatorial gate multiplexers of FIG. 1 or 3 in a tree structure. For example, the fabrication process 828 may include a computer readable storage medium storing computer executable instructions that are executable to cause a serializer, such as the apparatus 100 of FIG. 1, or the apparatus 300 of FIG. 3, to convert the parallel data input values to serial data output values using combinatorial logic circuits in a tree structure.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the apparatus 100 of FIG. 1, the apparatus 300 of FIG. 3, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the apparatus 100 of FIG. 1, the apparatus 300 of FIG. 3, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a represented printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-7 may illustrate remote units according to the teachings of the disclosure, the disclosure is not limited to these exemplary illustrated units. Embodiments of the disclosure may be suitably employed in any device that includes active integrated circuitry.

Thus, the apparatus 100 of FIG. 1, the apparatus 300 of FIG. 3, or any combination thereof, may be fabricated, processed, and incorporated into an electronic device, as described in the illustrative process 800. One or more aspects of the embodiments disclosed with respect to FIGS. 1 and 3 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is a non-transitory medium coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
receiving multiple data input values in parallel at an input tier of a selection circuit; and
generating, by a combinatorial gate multiplexer, a delayed version of an output clock signal, wherein the output clock signal is provided to a control input of the combinatorial gate multiplexer, and
selecting an output value at an output tier of the selection circuit based in part on the delayed version of the output clock signal, wherein the input tier includes multiple combinatorial gate multiplexers and wherein the output tier includes at least one combinatorial gate multiplexer.

2. The method of claim 1, wherein the at least one combinatorial gate multiplexer is a NAND multiplexer.

3. The method of claim 1, wherein the multiple combinational gate multiplexers are NAND multiplexers.

4. The method of claim 3, wherein each NAND multiplexer includes three two-input NAND gates.

5. The method of claim 3, further comprising:
receiving clock signals, each clock signal having a different phase, wherein each NAND multiplexer of the input tier performs a NAND operation of a particular one of the clock signals with one of the multiple data input values.

6. The method of claim 1, further comprising:
receiving clock signals, each clock signal having a different phase; and
generating the output clock signal for the output tier based on a combination of the clock signals.

7. The method of claim 6, wherein the combination of the clock signals to generate the output clock signal is performed using a combinatorial gate multiplexer having a same structure as the at least one combinatorial gate multiplexer of the output tier.

8. The method of claim 6, wherein the output clock signal has a duty cycle corresponding to a number of the multiple data input values.

9. The method of claim 8, wherein the number of the multiple data input values is seven and the output clock signal has approximately a forty-two percent duty cycle.

10. The method of claim 8, wherein the number of the multiple data input values is an odd number.

11. The method of claim 1, wherein the at least one combinatorial gate multiplexer of the output tier includes a root selection element and wherein the combinatorial gate multiplexer has a same structure as the root selection element of the output tier.

12. The method of claim 1, further comprising:
receiving multiple intermediate data values at an intermediate tier of the selection circuit from the input tier, wherein the intermediate tier includes multiple combinatorial gate multiplexers.

13. The method of claim 1, wherein receiving the multiple data input values and selecting the output value are performed at a serializer integrated in a semiconductor die.

14. The method of claim I, wherein a second control input of the combinatorial gate multiplexer is coupled to ground or to a negative supply voltage.

15. The method of claim 1, further comprising:
receiving a first clock signal at a control input of a second combinatorial gate multiplexer;
receiving a second clock signal at a data input of the second combinatorial gate multiplexer; and
generating the output clock signal by the second combinatorial gate multiplexer.

16. The method of claim 1, further comprising:
receiving a first clock signal at a control input of a second combinatorial gate multiplexer; and
generating the output clock signal by the second combinatorial gate multiplexer, wherein a data input of the second combinatorial gate multiplexer is coupled to a supply voltage.

17. A circuit comprising:
an input tier configured to receive multiple data input values in parallel;
a combinatorial gate multiplexer configured to receive an output clock signal at a control input of the combinatorial gate multiplexer and to generate a delayed version of the output clock signal; and
an output tier configured to select an output value based in part on the delayed version of the output clock signal, wherein the input tier includes multiple combinatorial gate multiplexers, and wherein the output tier includes at least one combinatorial gate multiplexer including the combinatorial gate multiplexer.

18. The circuit of claim 17, wherein the at least one combinatorial gate multiplexer is a NAND multiplexer.

19. The circuit of claim 17, wherein the multiple combinational gate multiplexers are NAND multiplexers.

20. The circuit of claim 19, wherein each NAND multiplexer includes three two-input NAND gates.

21. The circuit of claim 17, further comprising in the output tier a second combinatorial gate multiplexer configured to:
receive a first clock signal at a control input of the second combinatorial gate multiplexer;
receive a second clock signal at a data input of the second combinatorial gate multiplexer; and
generate the output clock signal.

22. The circuit of claim 21, wherein the first dock signal has a first phase and the second clock signal has a second phase that is different from the first phase.

23. The circuit of claim 17, further comprising in the output tier a second combinatorial gate multiplexer configured to receive a clock signal at a control input of the second combinatorial gate multiplexer and to generate the output clock signal, wherein a data input of the second combinatorial gate multiplexer is coupled to a supply voltage.

24. An apparatus comprising:
means for receiving multiple data input values in parallel, wherein the means for receiving includes multiple combinatorial gate multiplexers; and
means for generating a delayed version of an output clock signal, wherein the means for generating is configured to receive the output clock signal at a control input of the means for generating; and
means for selecting an output value based in part on the delayed version of the output clock signal, wherein the means for selecting includes at least one combinatorial gate multiplexer.

25. The circuit of claim 24, wherein the at least one combinatorial gate multiplexer is a NAND multiplexer.

26. The circuit of claim 24, wherein the multiple combinational gate multiplexers are NAND multiplexers.

27. The circuit of claim 26, wherein each NAND multiplexer includes three two-input NAND gates.

28. A method comprising:
a step for receiving multiple data input values in parallel at an input tier of a selection circuit;
a step for generating, by a combinatorial gate multiplexer, a delayed version of an output clock signal, wherein the output clock signal is provided to a control input of the combinatorial gate multiplexer; and
a step for selecting an output value at an output tier of the selection circuit based in part on the delayed version of the output clock signal, wherein the input tier includes multiple combinatorial gate multiplexers and wherein the output tier includes at least one combinatorial gate multiplexer including the combinatorial gate multiplexer.

29. The method of claim 28, wherein a second control input of the combinatorial gate multiplexer is coupled to ground or to a negative supply voltage.

30. The method of claim 28, wherein the at least one combinatorial gate multiplexer is a NAND multiplexer.

31. The method of claim 28, wherein the multiple combinational gate multiplexers are NAND multiplexers.

32. The method of claim 31, wherein each NAND multiplexer includes three two-input NAND gates.

33. A method comprising:

receiving a data file comprising design information corresponding to a semiconductor device; and fabricating the semiconductor device according to the design information, wherein the semiconductor device comprises:

an input tier configured to receive multiple data input values in parallel;

a combinatorial gate multiplexer configured to receive an output clock signal at a control input of the combinatorial gate multiplexer and to generate a delayed version of the output clock signal; and an output tier configured to select an output value at based in part on the delayed version of the output clock signal, wherein the input tier includes multiple combinatorial gate multiplexers, and wherein the output tier includes at least one combinatorial gate multiplexer including the combinatorial gate multiplexer.

34. The method of claim 33, wherein a second control input of the second combinatorial gate multiplexer is coupled to ground or to a negative voltage supply.

35. The method of claim 33, wherein the data file has a GDSII format.

36. The method of claim 33, wherein the data file has a GERBER format.

* * * * *